(12) United States Patent
Kantarovsky et al.

(10) Patent No.: US 12,154,956 B1
(45) Date of Patent: Nov. 26, 2024

(54) STRUCTURE INCLUDING MULTI-LEVEL FIELD PLATE AND METHOD OF FORMING THE STRUCTURE

(71) Applicant: GlobalFoundries U.S. Inc., Malta, NY (US)

(72) Inventors: Johnatan Avraham Kantarovsky, South Burlington, VT (US); Rajendran Krishnasamy, Essex Junction, VT (US); Mark D. Levy, Williston, VT (US); John J. Ellis-Monaghan, Grand Isle, VT (US); Michael J. Zierak, Colchester, VT (US); Kristin Marie Welch, Essex, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/632,902

(22) Filed: Apr. 11, 2024

(51) Int. Cl.
| | |
|---|---|
| H01L 29/51 | (2006.01) |
| H01L 29/20 | (2006.01) |
| H01L 29/40 | (2006.01) |
| H01L 29/66 | (2006.01) |
| H01L 29/778 | (2006.01) |

(52) U.S. Cl.
CPC ........ H01L 29/404 (2013.01); H01L 29/2003 (2013.01); H01L 29/401 (2013.01); H01L 29/66462 (2013.01); H01L 29/7786 (2013.01)

(58) Field of Classification Search
CPC . H01L 29/404; H01L 29/401; H01L 29/7786; H01L 29/6646
See application file for complete search history.

(56) References Cited

U.S. PATENT DOCUMENTS

| | | |
|---|---|---|
| 6,190,948 B1 | 2/2001 | Seok |
| 9,024,324 B2 | 5/2015 | Teplik |
| | (Continued) | |

OTHER PUBLICATIONS

Bahat-Treidel et al., AlGaN/GaN/AlGaN DH-HEMTs Breakdown Voltage Enhancement Using Multiple Grating Field Plates (MGFPs), IEEE Transactions on Electron Devices, vol. 57, No. 6, Jun. 2010, pp. 1208-1216.

(Continued)

*Primary Examiner* — Hoa B Trinh
(74) *Attorney, Agent, or Firm* — Francois Pagette; Hoffman Warnick LLC

(57) ABSTRACT

Disclosed are a structure with a multi-level field plate and a method of forming the structure. The field plate includes multiple first conductors on a dielectric layer and separated from each other by spaces with different widths (e.g., by with progressively decreasing widths). A conformal additional dielectric layer extends over the first conductors and onto the dielectric layer within the spaces. The field plate also includes, on the additional dielectric layer, second conductor(s) with portions thereof extending into the spaces. Within the spaces, the second conductor portions are at different heights (e.g., at progressively increasing heights) above the dielectric layer. Such a field plate can be incorporated into a transistor (e.g., a high electron mobility transistor (HEMT)) to, not only reduce the peak of an electric field exhibited proximal to a gate terminal, but to ensure the electric field is essentially uniform level between the gate and drain terminals.

16 Claims, 12 Drawing Sheets

(56) References Cited

U.S. PATENT DOCUMENTS

2009/0267116 A1    10/2009   Wu et al.
2014/0061659 A1     3/2014   Teplik et al.
2015/0295075 A1*   10/2015   Green ................ H01L 29/2003
                                                          257/76
2016/0343833 A1*   11/2016   Huang .............. H01L 29/66916

OTHER PUBLICATIONS

Coffie, "Slant Field Plate Model for Field-Effect Transistors," IEEE Transactions on Electron Devices, vol. 61, No. 8, Aug. 2014, pp. 2867-2872.

Lv et al., "Asymmetric GaN High Electron Mobility Transistors Design with InAlN Barrier at Source Side and AlGaN Barrier at Drain Side," Electronics 2024, 13, 653, published Feb. 4, 2024, 13 pages.

Rzin et al., "Impact of Gate Drain Spacing on Low-Frequency Noise Performance of In Situ SiN Passivated InAlGaN/GaN MIS-HEMTs," IEEE Transactions on Electron Devices, 2017, 64 (7), pp. 2820-2825, 10.1109/TED.2017.2703809.hal-01560627.

\* cited by examiner

STRUCTURE INCLUDING MULTI-LEVEL FIELD PLATE AND METHOD OF FORMING THE STRUCTURE

GOVERNMENT LICENSE RIGHTS

This disclosure was made with government support under contract number HQ0727790700 awarded by the Defense Microelectronics Agency (DMEA). The government has certain rights in the disclosure.

BACKGROUND

The present disclosure relates to a field plate and to a device (e.g., a high electron mobility transistor (HEMT)) incorporating the field plate for improved performance.

III-V semiconductor devices, such as high electron mobility transistors (HEMTs) (including HEMTs with Schottky contact gate terminals as well as metal-insulator-semiconductor HEMTs (MISHEMTs) that include a gate dielectric layer within the gate terminal) have emerged as a leading technology for power amplifier (PA) and for radio frequency (RF) applications, including millimeter wave (mmWave) (e.g., 3-300 GHz) wireless applications. Symmetric HEMTs, however, tend to exhibit a low breakdown voltage, which results in a limited maximum drain voltage swing. Depending upon the application, the limited maximum drain voltage swing may negatively affect performance. For example, in PA circuits, the limited maximum drain voltage swing of a HEMT may correspondingly reduce the dynamic range of the PA circuit. Techniques for improving HEMT performance by increasing the breakdown voltage include, for example, increasing the separation distance between gate and drain terminals and/or incorporating a field plate between the gate and drain terminals.

SUMMARY

Disclosed herein herein are embodiments of a semiconductor structure that includes a multi-level field plate.

Some embodiments of the semiconductor structure can include a dielectric layer and a field plate above the dielectric layer. Specifically, this field plate can include first conductors on the dielectric layer. The first conductors can be laterally separated by spaces and at least two of these spaces can have different widths. The field plate can also include an additional dielectric layer on the first conductors and within the spaces above the dielectric layer and at least one second conductor on the additional dielectric layer. In this field plate, at least two second conductor portions can extend into at least two of the spaces, respectively. Furthermore, within the at least two of the spaces, the at least two second conductor portions are at different heights above the dielectric layer.

Other embodiments of the semiconductor structure can similarly include a dielectric layer and a field plate above the dielectric layer. Specifically, the field plate can include first conductors on the dielectric layer and laterally separated by spaces. At least two of the spaces have different widths. The field plate can further include an additional dielectric layer extending over the first conductors and within the spaces above the dielectric layer. The field plate can further include second conductors on the additional dielectric layer. In this field plate, each second conductor can have a second conductor portion extending into one of the spaces. Furthermore, within the at least two spaces with different widths, the second conductor portions therein are at different heights above the dielectric layer.

Also disclosed herein are embodiments of a method of forming the above-described semiconductor structures. For example, in the method, a dielectric layer can be formed and a field plate can be formed above the dielectric layer. Specifically, the field plate can be formed so that it includes first conductors, which are on the dielectric layer and which are laterally separated by spaces with at least two of the spaces having different widths. The field plate can further be formed so that it includes an additional dielectric layer extending over the first conductors (including within the spaces therebetween) paces layer and so that it includes at least one second conductor on the additional dielectric layer. At least two second conductor portions of the at least one second conductor can extend into at least two of the spaces, respectively. Additionally, within those spaces, the second conductor portions can be at different heights above the dielectric layer.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which.

DETAILED DESCRIPTION

Figure 1A:
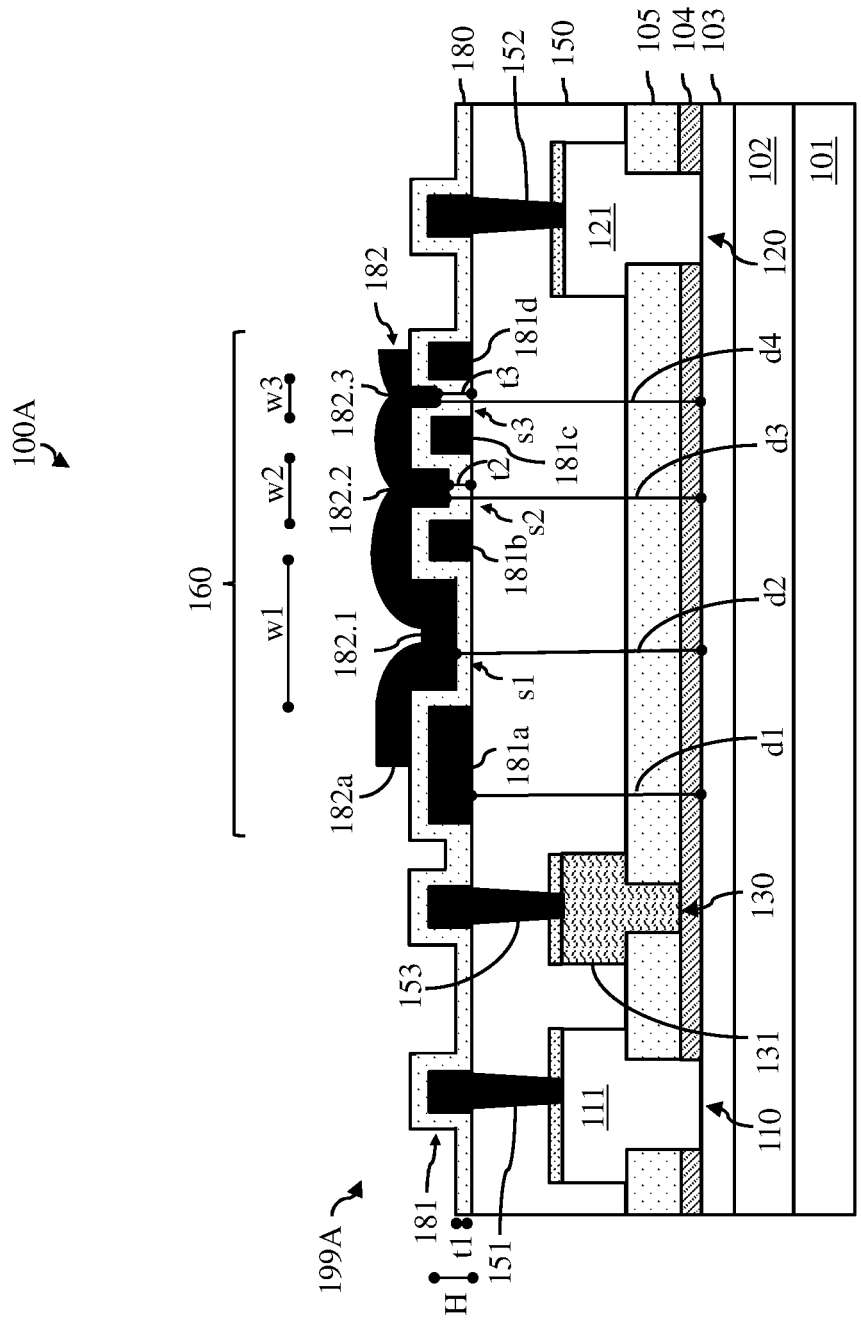
FIGS. 1A, 1B, 1C, 2, 3 and 4 are cross-section diagrams illustrating disclosed embodiments, respectively, of a semiconductor structure having a multi-level field plate.

As mentioned above, III-V semiconductor devices, such as high electron mobility transistors (HEMTs) (including HEMTs with Schottky contact gate terminals as well as MISHEMTs) have emerged as a leading technology for power amplifier (PA) and for radio frequency (RF) applications, including millimeter wave (mmWave) (e.g., 3-300 GHz) wireless applications. Symmetric HEMTs, however, tend to exhibit a low breakdown voltage, which results in a limited maximum drain voltage swing. Depending upon the application, the limited maximum drain voltage swing may negatively impact performance. For example, in PA circuits, the limited maximum drain voltage swing of a HEMT may correspondingly reduce the dynamic range of the PA circuit. Techniques for improving HEMT performance (e.g., by increasing the breakdown voltage) include, for example, increasing the separation distance between gate and drain terminals and/or incorporating a field plate between the gate and drain terminals. Typically, when a field plate is incorporated into a HEMT, it is positioned adjacent to the gate terminal on the drain terminal side of the structure and it is a single-level structure. Such a field plate reshapes the electric field in the channel layer on the drain terminal side of the HEMT and, more specifically, reduces a peak in the electric field near the gate terminal on the drain terminal side of the HEMT.

In view of the foregoing, disclosed herein are embodiments of a semiconductor structure including a multi-level field plate. The multi-level field plate can include laterally adjacent first conductors, which are on a top surface of a dielectric layer. At least some of these first conductors can be separated by spaces with different widths (e.g., with progressively decreasing widths). A conformal additional dielectric layer can extend over the first conductors and onto the dielectric layer within the spaces. Due to the different widths (and, thus, the different aspect ratios) of the spaces, portions of the additional dielectric layer on the dielectric layer and at the centers of the spaces can have different thicknesses (e.g., progressively increasing thicknesses). The multi-level field plate can further include second conductor(s) on the additional dielectric layer. Portions of the second conductor(s) can extend into the spaces between the first conductors and can be at different heights (e.g., at progressively increasing heights) above the dielectric layer because of the different thicknesses of the portions of additional dielectric layer on which they land. Such a multi-level field plate can be incorporated into a semiconductor device to reshape an electric field therein and thereby adjust device performance. For example, such a multi-level field plate can be incorporated into a transistor (e.g., a HEMT, such as a HEMT with a Schottky contact gate terminal or a MISHEMT) to reduce the peak of an electric field in the channel layer adjacent to the gate terminal and to level-out the electrical field across the channel layer between the gate terminal and the drain terminal. Also disclosed herein are embodiments of a method of forming such a semiconductor structure.

More particularly, referring to FIGS. 1A-1C, 2, 3 and 4, disclosed herein are embodiments of a semiconductor structure 100A-100C, 200, 300 and 400, respectively. Semiconductor structure 100A-100C, 200, 300, 400 can include a substrate 101. Substrate 101 can be, for example, a silicon or silicon-based substrate (e.g., a silicon carbide (SiC) substrate), a sapphire substrate, or a III-V semiconductor substrate (e.g., a gallium nitride (GaN) substrate or some other suitable III-V semiconductor substrate).

Semiconductor structure 100A-100C, 200, 300, 400 can include a multi-level field plate 160, 260, 360, 460 on a dielectric layer 150 above substrate 101. This multi-level field plate 160, 260, 360, 460 could be incorporated into a semiconductor device to reshape an electric field across a particular area of the semiconductor device in order to adjust device performance. This semiconductor device could be any type of semiconductor device that could benefit from electric field reshaping. For example, the semiconductor device could be a HEMT (e.g., a HEMT with a Schottky contact gate terminal or a MISHEMT). A multi-level field plate 160, 260, 360, 460 could be incorporated into the HEMT to level out (e.g., make essentially uniform) an electrical field in the channel layer between gate and drain terminals, as discussed in greater detail below.

FIGS. 1A, 2, 3 and 4 show a multi-level field plate 160, 260, 360, 460 incorporated into a HEMT 199A, 299, 399 and 499 with a Schottky contact gate terminal. FIGS. 1B and 1C show a multi-level field plate 160 incorporated into a MISHEMT 199B (see FIG. 1B) or into a differently configured MISHEMT 199C (see FIG. 1C) with a gate terminal that includes both a gate dielectric layer and a gate conductor layer. While multi-level field plates 260, 360, and 460 are only shown in the figures as being incorporated into a HEMT having a Schottky contact gate terminal, it should be understood these same multi-level field plates 260, 360, and 460 could instead be incorporated into a MISHEMT. Furthermore, the configurations of the various HEMTs shown in the figures and described in greater detail below are provided for illustration purposes and are not intended to be limiting. Alternatively, multi-level field plates 160, 260, 360, and/or 460 could be incorporated into any other now known or subsequently developed type of HEMT or any other now known or subsequently developed type of semiconductor device that could benefit from such a multi-level field plate structure (e.g., to reshape an electric field therein).

Referring to FIGS. 1A-1C, 2, 3 and 4, whether a HEMT with a Schottky gate contact terminal or a MISHEMT, HEMT 199A, 199B, 199C, 299, 399, 499 can include a stack of semiconductor layers (e.g., epitaxially grown semiconductor layers). The semiconductor layers can include, for example: a buffer layer 102 on substrate 101; a channel layer 103 on buffer layer 102; and a barrier layer 104 on the channel layer 103.

Buffer layer 102 can include a layer of gallium nitride (GaN), aluminum nitride (AlN), or a layer of any other semiconductor material suitable for use as a buffer layer in a HEMT. Those skilled in the art will recognize that such a buffer layer is employed as an anchor to achieve nucleation and to duplicate orientation in subsequently grown epitaxial semiconductor layers. Optionally, buffer layer 102 can be doped (e.g., buffer layer 102 can be carbon-doped). Channel layer 103 can be above and immediately adjacent to buffer layer 102. Channel layer 103 can be a layer of a III-V semiconductor material. Those skilled in the art will recognize that a III-V semiconductor material refers to a compound obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). Barrier layer 104 can be above and immediately adjacent to channel layer 103. Barrier layer 104 can have a band gap that is wider than the bandgap of the III-V semiconductor material of channel layer 103. Those skilled in the art will recognize that the barrier and channel materials can be selected so that a heterojunction is formed at the interface between the two layers, thereby resulting in the formation of a two-dimensional electron gas (2 DEG) in the channel layer 103. This 2 DEG in the channel layer 103 can provide the conductive pathway for the drifting of charges between the source and the drain. Thus, for example, if channel layer 103 is a layer of GaN, then barrier layer 104 could be a layer of aluminum gallium nitride (AlGaN), aluminum nitride (AlN), or any other material suitable for use as a barrier layer in such a HEMT. For illustration purposes, buffer layer 102, channel layer 103 and barrier layer 104 are described above and illustrated in the figures as being single-layered structures. Alternatively, any one or more of these layers could include multiple sub-layers (not shown).

Optionally, a gate dielectric layer 132 can be above and immediately adjacent to barrier layer 104 (e.g., for MISHEMT 199B of FIG. 1B). This gate dielectric layer 132 can be, for example, a silicon dioxide ($SiO_2$) layer, a high K dielectric layer or a layer of any other dielectric material suitable for use as a gate dielectric layer of a MISHEMT. Examples of high-K dielectric materials include, but are not limited to, a hafnium (Hf)-based dielectric (e.g., hafnium oxide, hafnium silicon oxide, hafnium silicon oxynitride, hafnium aluminum oxide, etc.) or some other suitable high-K dielectric (e.g., aluminum oxide, tantalum oxide, zirconium oxide, etc.).

A cap layer 105 can be above and immediately adjacent to barrier layer 104 (e.g., see FIGS. 1A, 1C, and 2-4), or if applicable, above and immediately adjacent to gate dielectric layer 133 (e.g., see FIG. 1B). Cap layer 105 can be an isolation layer. For example, cap layer 105 can include a layer of isolation material such as a silicon nitride (SiN) layer, a silicon dioxide (SiO$_2$) layer, a low K dielectric layer, or a layer of any other suitable isolation material. Examples of low-K dielectric materials include, but are not limited to, silicon-boron-carbon-nitride (SiBCN), silicon-oxygen-carbon-nitride (SiONC), silicon-carbon-nitride (SiCN), silicon oxycarbide (SiCO), and hydrogenated silicon oxycarbide (SiCOH).

HEMT 199A, 199B, 199C, 299, 399, 499 can further include a gate terminal 130 in a gate opening. Specifically, the gate opening extend vertically through cap layer 105. In a HEMT 199A (see FIG. 1A), 299 (see FIG. 2), 399 (see FIG. 3), 499 (see FIG. 4) with a Schottky contact gate terminal, the gate opening can extend to the top surface of barrier layer 104. In a MISHEMT 199B (see FIG. 1B), the gate opening can extend to the top surface of gate dielectric layer 132. In another MISHEMT 199C (see FIG. 1C), the gate opening can extend to the top surface of barrier layer 104 and can further be lined with a conformal gate dielectric layer 133. This gate dielectric layer 133 can be, for example, a silicon dioxide (SiO$_2$) layer, a high K dielectric layer (see example high-K dielectric materials discussed above) or a layer of any other dielectric material suitable for use as a gate dielectric layer of a MISHEMT. Gate terminal 130 can include gate conductor material 131 that at least fills the gate opening. Optionally, gate terminal 130 can be essentially T-shaped with a narrow lower portion in the gate opening and with a wider upper portion above the lower narrow portion and further extending laterally onto the top surface of cap layer 105 (as illustrated). In HEMT 199A (see FIG. 1A), 299 (see FIG. 2), 399 (see FIG. 3), 499 (see FIG. 4), gate terminal 130 is specifically a Schottky contact gate terminal immediately adjacent to barrier layer 104. Thus, gate conductor material 131 includes metal(s) or metal alloy(s) that will form such a Schottky contact (i.e., a potential energy barrier for electrons) at the metal-semiconductor junction at the bottom of the gate opening. Since MISHEMTs do not require a Schottky contact gate terminal, gate conductor material 131 of MISHEMT 199B or 199C (see FIGS. 1B and 1C) could include one layer or multiple sub-layers of any suitable gate conductor material (e.g., gate metal(s), gate metal alloy(s), doped polysilicon, etc.).

For purposes of illustration, HEMTs 199A-199C, 299, 399, 400 as described above and shown in the figures are depletion mode (d-mode) transistors. A d-mode transistor refers to a transistor that is normally in an ON-state (i.e., conductive) and only switches to an OFF-state (i.e., becomes non-conductive) when a voltage is applied to the gate of the transistor. This is due to a zero-bias two-dimensional electron gas (2 DEG) below gate terminal 130 and, particularly, between the barrier layer 104 and channel layer 103. Those skilled in the art will recognize that gate terminal 130 could, however, be modified to form an enhancement mode (e-mode transistor). An e-mode transistor refers to a transistor that is normally in an OFF-state (i.e., non-conductive) and only switches to an ON-state (i.e., becomes conductive) when a voltage is applied to the gate. One technique for modifying a gate terminal of a d-mode HEMT to form an e-mode HEMT is to insert a P-type III-V semiconductor layer into gate terminal 130 in order to suppress the zero-bias 2 DEG. For example, this P-type III-V semiconductor layer could be an additional epitaxially grown semiconductor layer (e.g., an epitaxially grown magnesium (Mg)-doped gallium nitride (GaN) layer or some other suitable epitaxially grown P-type III-V semiconductor layer) in the stack above and immediately adjacent to barrier layer 104. In this case, gate opening that contains gate conductor material 131 would extend through cap layer 105 to P-type II-V semiconductor layer such that the P-type III-V semiconductor layer separates the gate conductor material 131 from barrier layer 104, thereby creating the e-mode device.

HEMT 199A, 199B, 199C, 299, 399, 499 can further include source and drain terminals 110, 120 in source/drain openings, respectively. Gate terminal 130 can be positioned laterally between these source and drain terminals 110, 120. In some embodiments, gate terminal 130 could be separated from source terminal 110 and from drain terminal 120 by approximately equal distances. Alternatively, gate terminal 130 could be separated from source terminal 110 and from drain terminal 120 by different distances. For example, as illustrated in the figures, gate terminal 130 could be spaced farther away from drain terminal 120 than it is from source terminal 110. In any case source/drain openings can each extend vertically through cap layer 105 into and, optionally, completely through barrier layer 104 to channel layer 103. Source/drain terminals 110, 120 can include source/drain conductor materials 111, 121 that at least fill the source/drain openings. Optionally, source/drain terminals 110, 120 can be essentially T-shaped each with a narrow lower portion filling a source/drain opening and with a wider upper portion above the lower narrow portion and further extending laterally onto the top surface of cap layer 105 (as illustrated). Source/drain conductor materials 111, 121 can be selected to create metal-semiconductor junctions and, particularly, ohmic contacts at the bottom of the source/drain openings. Examples of metal and/or metal alloys for such ohmic contacts include, but are not limited to, Ti/Al/TiN, Ti/Al/Ti/Au or Mo/Al/Mo/Au.

One or more middle of the line (MOL) dielectric layers can cover the various terminals of HEMT 199A, 199B, 199C, 299, 399, 499 and can further cover the top surface of cap layer 105 around and between those terminals. The MOL dielectric layers can include, but are not limited to, an optional conformal etch stop layer (not shown) and a dielectric layer 150 on the conformal etch stop layer. Dielectric layer 150 can be a blanket layer of interlayer dielectric (ILD) material (e.g., a blanket layer of silicon dioxide layer or a blanket layer of any other suitable ILD material). Dielectric layer 150 can have a top surface, which is essentially planar (e.g., due to chemical mechanical polishing (CMP) of the blanket layer performed during fabrication). MOL contacts 151-153 can extend through dielectric layer 150 (and any other MOL dielectric layers) to source terminal 110, drain terminal 120, and gate terminal 130, respectively.

As mentioned above, HEMT 199A, 199B, 199C, 299, 399, 499 can incorporate a multi-level field plate 160, 260, 360, 460. This multi-level field plate 160, 260, 360, 460 can specifically be positioned on the top surface of dielectric layer 150 above an area that extends between gate terminal 130 and drain terminal 120.

Multi-level field plate 160, 260, 360 and 460 can include any number of three or more first conductors on dielectric layer 150. For purposes of illustration, multi-level field plate 160, 260, 360, and 460 is described below and illustrated in the figures as having four first conductors 181a-181d. It should be understood that the figures and description are not intended to be limiting. Alternatively, multi-level field plate 160, 260, 360, 460 could include only three first conductors (e.g., only first conductors 181a-181c) or more than four first conductors.

First conductors 181a-181c and optional first conductor 181d can be laterally adjacent, parallel, metal or metal alloy plates and/or wires. They can be lithographically patterned and etched, during processing, from the same first metallic layer 181 and they can have a same height H, as measured from the top surface of dielectric layer 150. First metallic layer 181 can be included in a back end of the line (BEOL) metal level, such as the first BEOL metal level (M1). First metallic layer 181 can include one or more layers of metal or metal alloy material(s). For example, first metallic layer 181 could be copper. Alternatively, first metallic layer 181 could be any other suitable BEOL metal or metal alloy material(s) now known or subsequently developed (e.g., aluminum, cobalt, ruthenium, molybdenum, iridium, etc. or alloys thereof). Optionally, additional conductors could be concurrently lithographically patterned and etched from the same first metallic layer 181 to provide electrical connections to MOL contacts. For example, see additional conductors on MOL contacts 151, 152 and 153 to source terminal 110, drain terminal 120, and gate terminal 130, respectively, in HEMT 199A, 199B, 299C, 299, 399, 499.

First conductors 181a-181c (and, optionally, 181d) can have the same or different widths. They can be physically separated from each other by spaces. Each space between a pair of adjacent first conductors can have a corresponding width. That is, as illustrated in FIGS. 1A-1C, 2, 3 and 4, space s1 between adjacent first conductors 181a and 181b can have a width w1. Space s2 between adjacent first conductors 181b and 181c can have a width w2. Optionally, space s3 between adjacent first conductors 181c and 181d can have a width w3, and so on. Furthermore, at least two spaces and, optionally, all spaces between any two adjacent first conductors can have different widths. In some embodiments, the different widths of the spaces can decrease progressively from one end of the multi-level field plate 160, 260, 360, 460 toward the opposite end.

In a HEMT 199A, 199B, 199C, 299, 399, 499, first conductors 181a-181c and optional first conductor 181d can extend laterally across the width of the HEMT (e.g., in a direction parallel to gate terminal 130 and drain terminal 120). Furthermore, first conductors 181a-181c and optional first conductor 181d can be at the same level above the top surface of channel layer 103. That is, these first conductors can all be separated from channel layer 103 by the same separation distance d1. The spaces between the first conductors can have progressively decreasing widths from one end of multi-level field plate 160, 260, 360, 460 adjacent to gate terminal 130 toward the opposite end of multi-level field plate 160, 260, 360, 460 adjacent to drain terminal 120. That is, as illustrated, width w1 of space s1 can be greater than width w2 of space s2. And, if multi-level field plate 160, 260, 360, 460 includes four first conductors 181a-181d, the width w2 of space s2 can be greater than the width w3 of space s3. When all first conductors have the same height H and the spaces between adjacent first conductors have progressively decreasing widths from one end of the multi-level field plate to the other, the aspect ratio of space s2 can be relatively high and, particularly, higher than the aspect ratio of space s1. And, if the multi-level field plate 160, 260, 360, 460 includes four first conductors 181a-181d, the aspect ratio of space s3 can be even higher than the aspect ratio of a space s2.

Multi-level field plate 160, 260, 360, 460 can further include an additional dielectric layer 180. Additional dielectric layer 180 can include a relatively thin conformal layer of a dielectric material (e.g., silicon nitride, silicon dioxide, silicon oxynitride or any other dielectric material employed in BEOL processing). Alternatively, additional dielectric layer 180 can include a stack of two or more relatively thin conformal layers of different dielectric materials (e.g., silicon nitride and one or more additional dielectric materials). Additional dielectric layer 180 can be formed (e.g., conformally deposited) over the patterned plates and/or wires of first metallic layer 181 and on exposed surfaces of dielectric layer 150. Thus, within multi-level field plate 160, 260, 360, 460, additional dielectric layer 180 can be on the top and side surfaces of first conductors 181a-181c and optional first conductor 181d and can further be within the spaces therebetween. Generally, the thickness t1 of additional dielectric layer 180 can be less than (e.g., ¼, ⅕, ⅙, etc.) the height H of first conductors 181a-181d, as measured from the top surface of dielectric layer 150 in either open areas devoid of any patterned plates and/or wires of first metallic layer 181 or at the center of relatively low aspect ratio spaces between patterned plates and/or wires of first metallic layer 181 (e.g., as measured between adjacent first conductors 181a and 181b at the center of space s1). However, at the centers of any relatively high aspect ratio spaces (e.g., see spaces s2 and s3), horizontal portions of additional dielectric layer 180 may be relatively thick (e.g., see thickness t2 and t3). Thickness(es) greater than t1 can be the result of pinch off during deposition of additional dielectric layer 180 into high aspect ratio space(s).

In a HEMT 199A, 199B, 199C, 299, 399, 499 where first conductors 181a-181c and optional first conductor 181d of multi-level field plate 160, 260, 360, 460 are separated by spaces with progressively decreasing widths (e.g., w1>w2>w3), horizontal portions of additional dielectric layer 180 at the centers of those spaces can have progressively increasing thicknesses from one end of the multi-level field plate 160, 260, 360, 460 adjacent to gate terminal 130 toward the opposite end of the adjacent to drain terminal 120. That is, thickness t2 of the horizontal portion of additional dielectric layer 180 at the center of space s2 can be greater than thickness t1 of the horizontal portion of additional dielectric layer 180 at the center of space s1 and, if applicable, thickness t3 of the horizontal portion of additional dielectric layer 180 at the center of space s3 can be greater than the thickness t2.

Multi-level field plate 160, 260, 360, 460 can further include at least one second conductor on additional dielectric layer 180. Generally, in multi-level field plate 160, 260, 360, 460 at least two second conductor portions 182.1-182.2 of the second conductor(s) can extend into at least two of spaces, respectively, between any two adjacent first conductors (e.g., into spaces s1 and s2). Furthermore, given the different thicknesses of the horizontal portions of additional dielectric layer 180 within and at the centers of these spaces, the second conductor portions can be at different heights above dielectric layer 150. The multi-level field plates 160, 260, 360, 460 shown in the figures vary with regard to the number and placement of second conductor(s) therein.

Figure 1B:
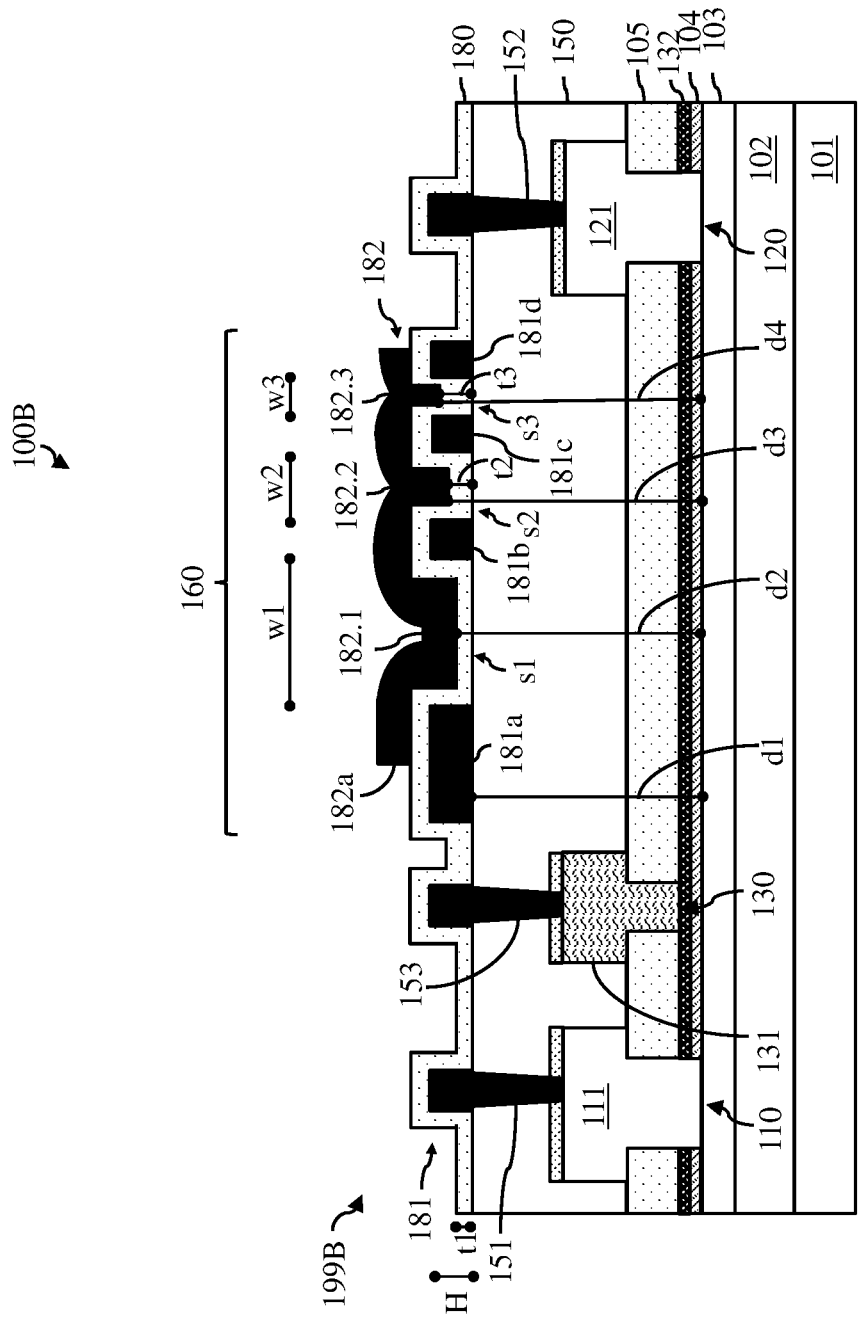
Figure 1C:
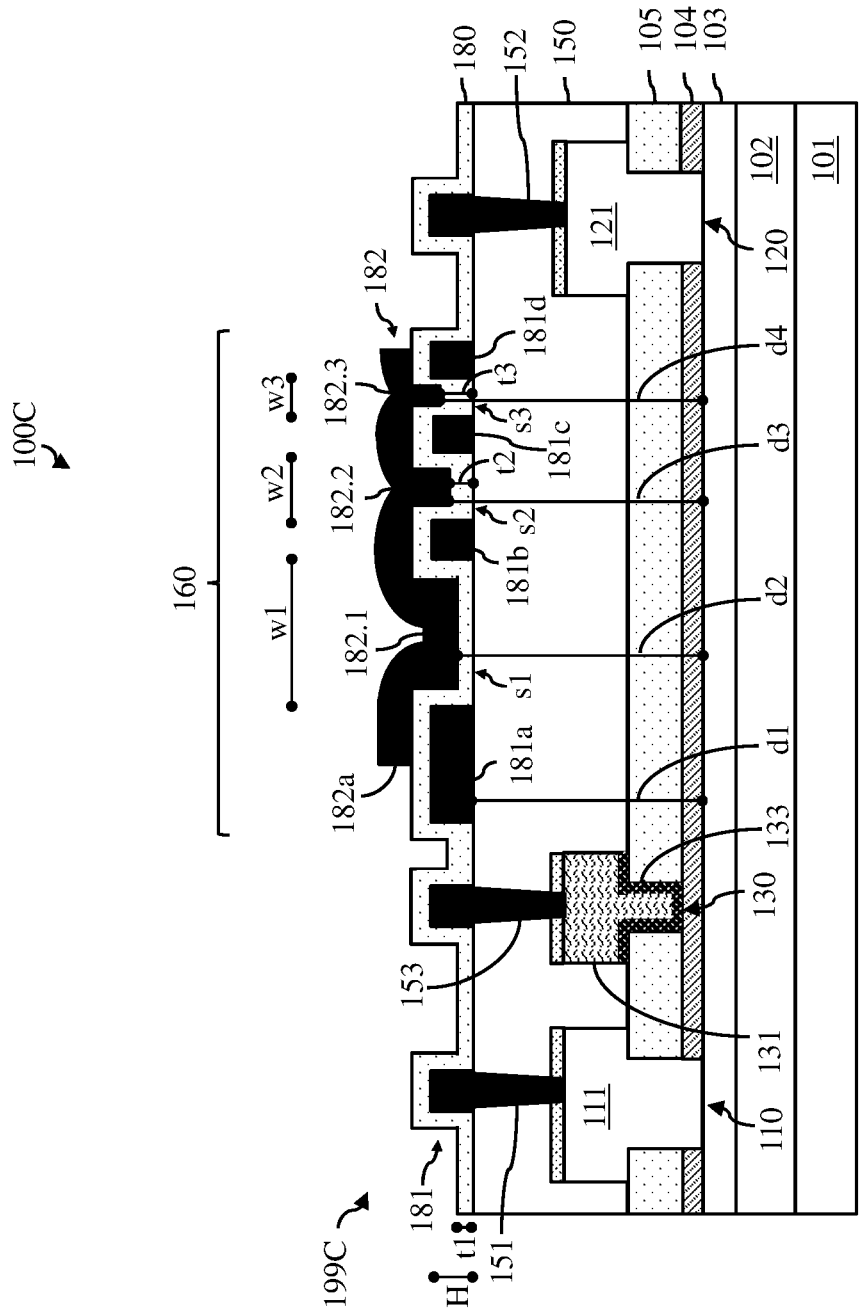

For example, multi-level field plate 160 of FIGS. 1A-1C can include a single second conductor 182a. Second conductor 182a can include second conductor portions 182.1-182.2 extending into spaces s1-s2, respectively. And, if multi-level field plate 160 includes four first conductors 181a-181d, second conductor 182a can further include another second conductor portion 182.3 extending into space s3. In HEMT 199A, 199B, 199C of multi-level field plate 160, opposite ends of this second conductor 182a could be adjacent gate terminal 130 and drain terminal 120, respectively. Optionally, one end could be adjacent or aligned above first conductor 181a closest to gate terminal 130 and the opposite end could be adjacent or aligned above first conductor 181c or, if applicable, first conductor 181d. Thus, in multi-level field plate 160, second conductor portions 182.1-182.2 (and, if applicable, second conductor portion 182.3) are at different heights above the level of dielectric layer 150.

Figure 2:
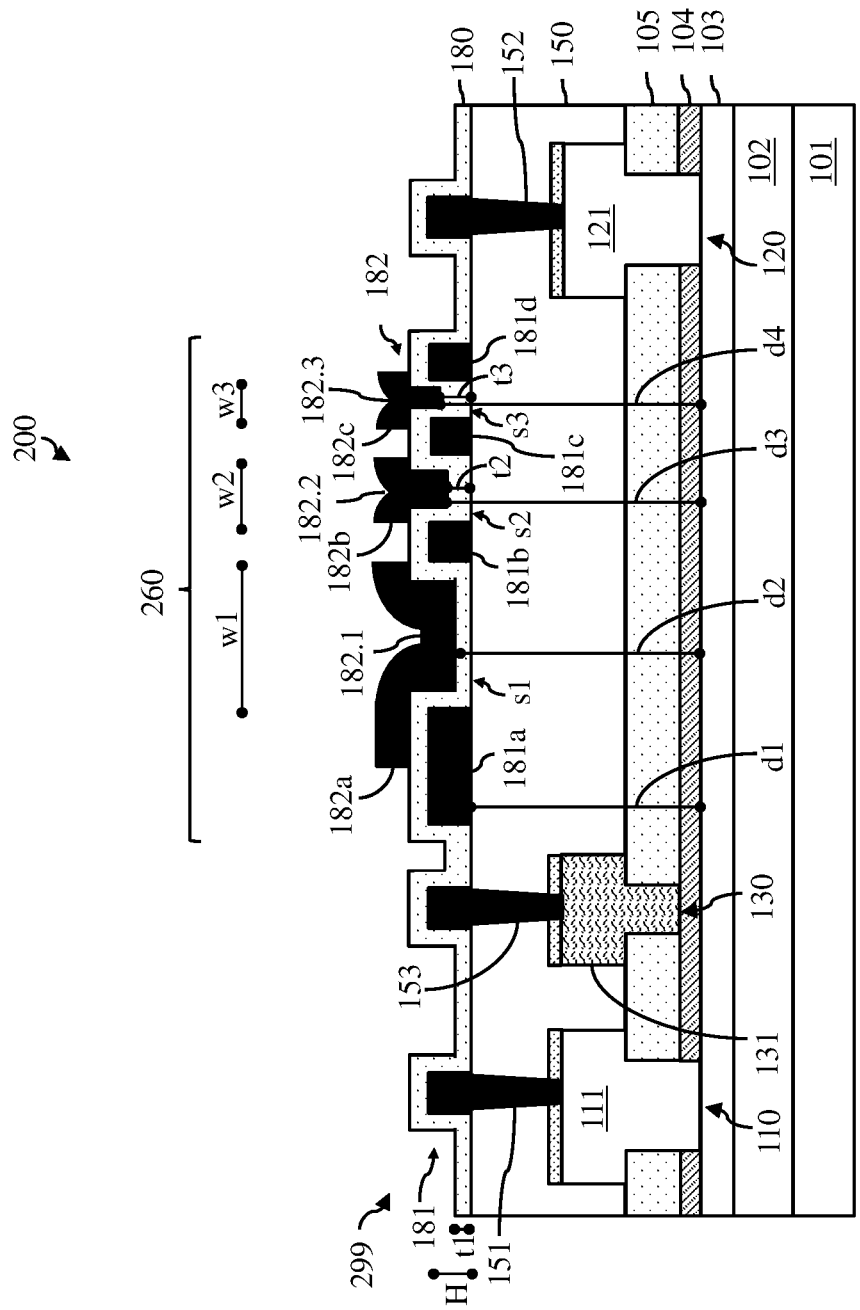

Multi-level field plate 260 of FIG. 2 can include at least two second conductors 182a-182b. And, if multi-level field plate 260 includes four first conductors 181a-181d, it can also include another second conductor 182c. These second conductors can be physically separated from each other and can each include a second conductor portion that extends into a corresponding one of the spaces. For example, in HEMT 299 of multi-level field plate 260, second conductor 182a can extend from above or adjacent first conductor 181a to adjacent or above first conductor 181b and can have a second conductor portion 182.1 that extends into space s1. Second conductor 182b can extend from above or adjacent first conductor 181b to adjacent or above first conductor 181c and can have a second conductor portion 182.2 that extends into space s2. Optionally, a second conductor 182c can extend from above or adjacent a first conductor 181c to adjacent or above a first conductor 181d and can have a second conductor portion 182.3 that extends into a space s3. Thus, in multi-level field plate 260, second conductor portions 182.1-182.2 (and, if applicable, second conductor portion 182.3) are similarly at different heights above the level of dielectric layer 150.

Figure 3:
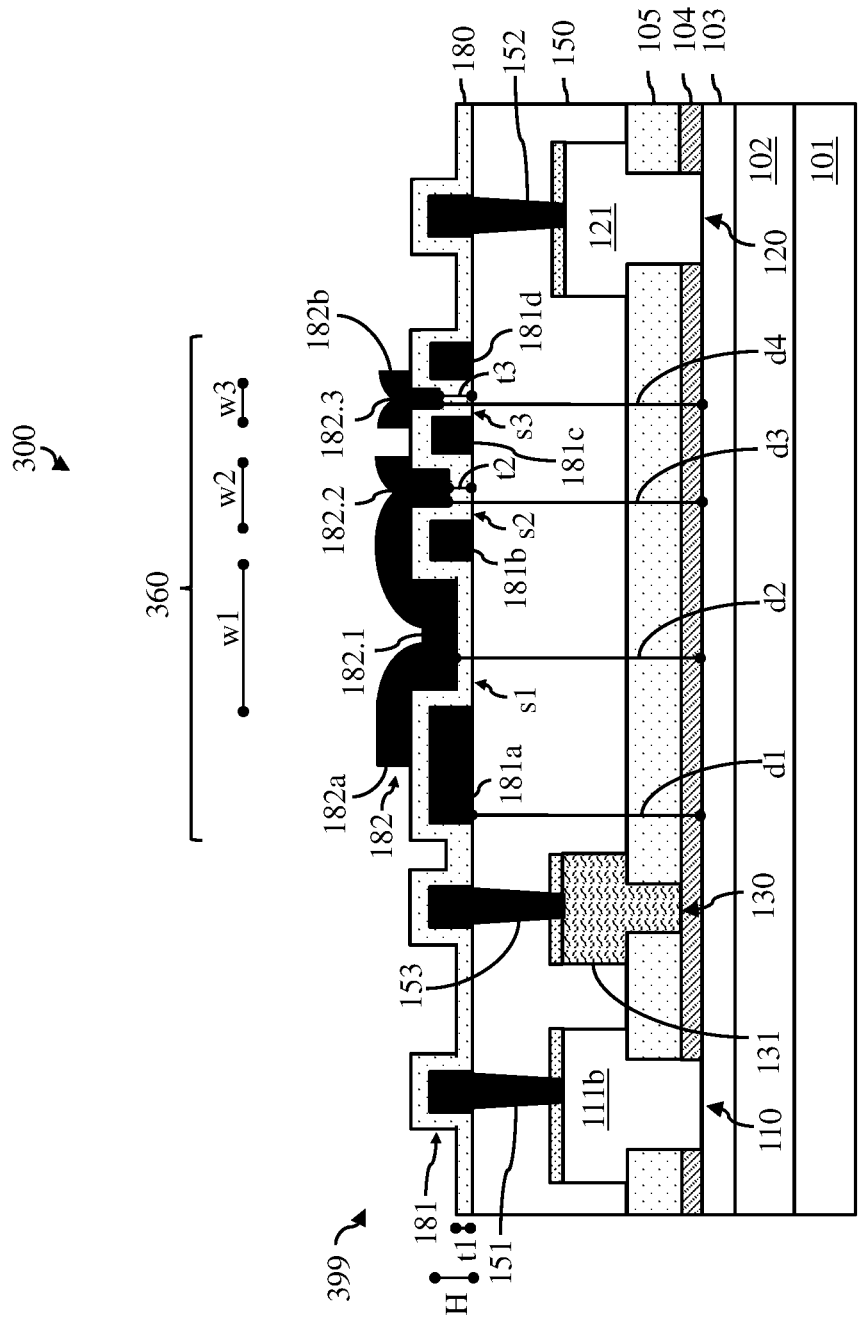
Figure 4:
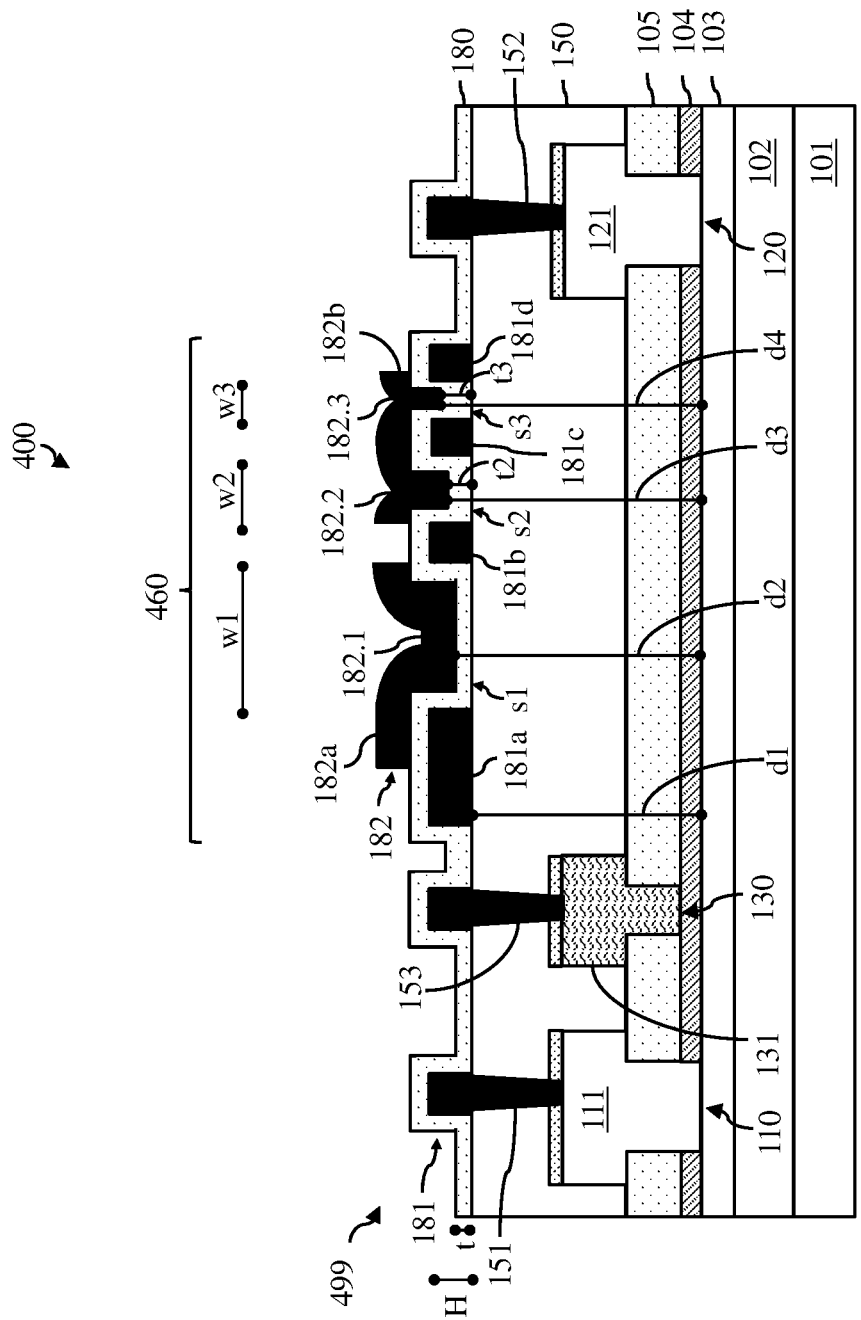

Multi-level field plate 360 of FIG. 3 and multi-level field plate 460 of FIG. 4 can each include at least four first conductors 181a-181d on dielectric layer 150, an additional dielectric layer on first conductors 181a-181d and in the spaces therebetween, and multiple second conductors 182a-182b on additional dielectric layer 180. Second conductors 182a-182b can be physically separated from each other and can have different numbers of second conductor portions extending into different numbers of spaces between adjacent first conductors. For example, in HEMT 399 of multi-level field plate 360, second conductor 182a can extend from above or adjacent first conductor 181a to adjacent or above first conductor 181c and can have second conductor portions 182.1 and 182.2 that extend into spaces s1 and s2, respectively. Second conductor 182b can extend from above or adjacent first conductor 181c to adjacent or above first conductor 181d and can have a second conductor portion 182.3 that extends into space s3. In HEMT 499 of multi-level field plate 460, second conductor 182a can extend from above or adjacent first conductor 181a to adjacent or above first conductor 181b and can have a second conductor portion 182.1 that extends into space s1. Second conductor 182b can extend from above or adjacent first conductor 181b to adjacent or above first conductor 181d and can have second conductor portions 182.2 and 182.3 that extend into spaces s2 and s3, respectively. Thus, in these multi-level field plates 360 and 460, second conductor portions 182.1-182.3 are at different heights above the level of dielectric layer 150.

It should be noted that, during processing to form multi-level field plate 160, 260, 360, 460, the second conductor(s) can be lithographically patterned and etched from a second metallic layer 182. Second metallic layer 182 can be included in a back end of the line (BEOL) metal level, such as the second BEOL metal level (M2). Second metallic layer 182 can include one or more layers of metal or metal alloy material(s). The metal or metal alloy material(s) of second metallic layer 182 can be the same as the metal or metal alloy material(s) of the first metallic layer 181. Alternatively, the metal or metal alloy material(s) of the first and second metallic layers 181-182 could be different. Thus, second metallic layer 182 could be copper. Alternatively, second metallic layer 182 could be any other suitable BEOL metal or metal alloy material(s) now known or subsequently developed (e.g., aluminum, cobalt, ruthenium, molybdenum, iridium, etc., or alloys thereof).

Furthermore, since in each multi-level field plate 160, 260, 360, 460, second conductor portions 182.1-182.2 and, if applicable, second conductor portion 182.3 are at different heights above the level of dielectric layer 150, the separation distances d2-d4 between these second conductor portions and channel layer 103 are greater than the separation distance d1 between each first conductor and channel layer 103. Furthermore, d2-d4 can be different from each other. For example, see the progressively increasing separation distances d1-d3. Such a multi-level field plate 160, 260, 360, 460 in a HEMT 199A-199C, 299, 399, 499 between a gate terminal 130 and a drain terminal 120, can be employed to not only reduce a peak in the electric field in channel layer 103 close to gate terminal 130, but also to level out the electric field across the device between gate terminal 130 and drain terminal 120.

It should be noted that in multi-level field plate 160, 260, 360, 460 first conductor 181a could be electrically connected to a biasing circuit for receiving a bias voltage and all other first conductors could be grounded or left floating. Additionally, in multi-level field plate 160, 260, 360, 460 each second conductor could be connected to a biasing circuit, grounded, or left floating. For example, in multi-level field plate 160, second conductor 182a could be connected to a biasing circuit for receiving a bias voltage, connected to ground, or left floating. In multi-level field plate 260, second conductors 182a-182b and, if applicable, second conductor 182c could each be connected to a biasing circuit for receiving a bias voltage, connected to ground, or left floating. In multi-level field plate 360 or 460, second conductors 182a-182b could each be connected to a biasing circuit for receiving a bias voltage, connected to ground, or left floating. Individual conductors (first or second conductors) of a multi-level field plate connected to a biasing circuit can each receive the same bias voltage or can receive two or more different bias voltages. Adjusting the bias voltages applied to conductors contained in multi-level field plate 160, 260, 360, 460 and located at different levels therein can be employed to further reshape an electric field in the device that incorporates field plate (e.g., can be employed to further reshape an electric field in a channel layer between a gate terminal 130 and a drain terminal 120 of a HEMT 199A, 199B, 199C, 299, 399, 499).

Figure 5:
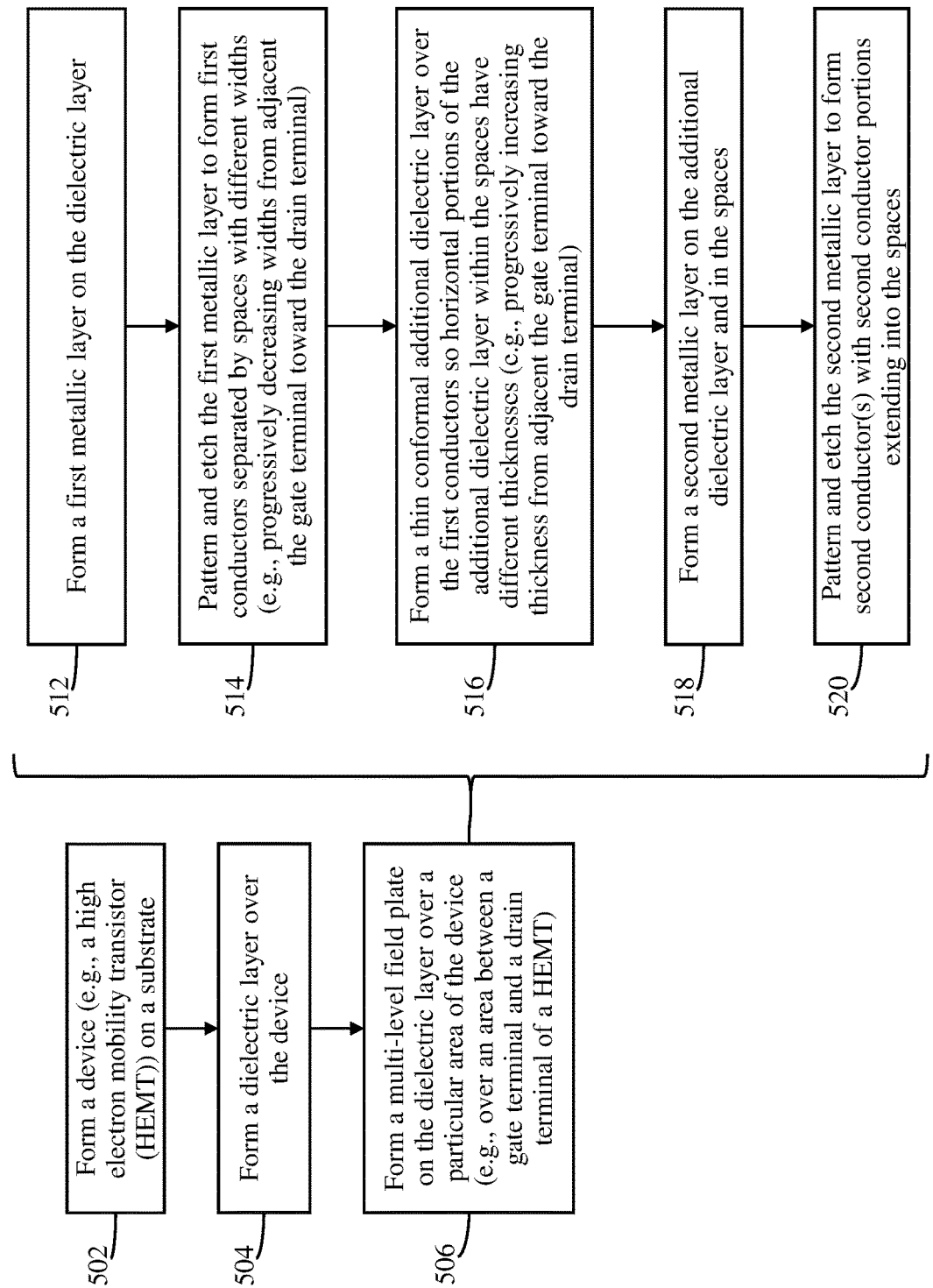
FIG. 5 is a flow diagram illustrating disclosed embodiments of a method of forming a semiconductor structure having a multi-level field plate.

Referring to the flow diagram of FIG. 5, also disclosed herein are embodiments of a method of forming a semiconductor structure including a multi-level field plate and a device, such as a HEMT, that incorporates the multi-level field plate (e.g., see semiconductor structures 100A of FIG. 1A, 100B of FIG. 1B, 100C of FIG. 1C, 200 of FIG. 2, 300 of FIG. 3 or 400 of FIG. 4).

Figure 6:
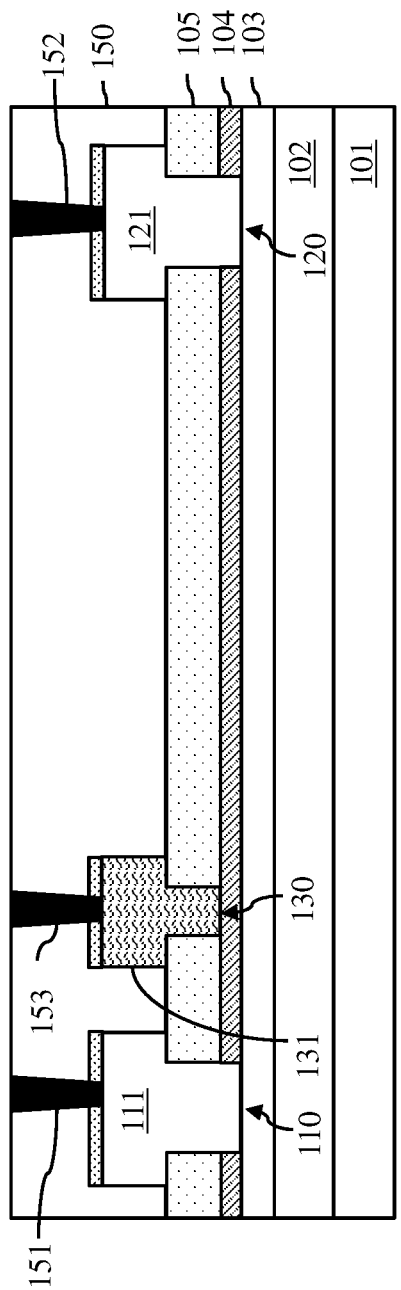
FIGS. 6-10 are cross-section diagrams illustrating partially completed semiconductor structures formed according to the flow diagram of FIG. 5.

The method can include providing a substrate 101 (see process 502 and FIG. 6). The method can further include forming a device on substrate 101 (see process 502 and FIG. 6). The device can be any device that could benefit from incorporation of a multi-level field plate. For example, the device formed at process 502 could be a HEMT (e.g., a HEMT 199A, 299, 399, 499 with a Schottky contact gate terminal, as illustrated in FIGS. 1A, 2, 3, and 4, or a MISHEMT 199B or 199C as illustrated in FIG. 1B or 1C). Furthermore, the HEMT can be either a d-mode HEMT or an e-mode HEMT. Techniques for forming such devices are well known in the art and, thus, the details thereof have been omitted from this specification in order to allow the reader to focus on the salient aspects of the disclosed embodiments related to formation of the multi-level field plate.

Next, MOL processing can be performed (see process 504 and FIG. 6). For example, one or more MOL dielectric layers can be formed over the device (e.g., over the HEMT). The MOL dielectric layers can, for example, include an optional conformal etch stop layer (not shown) and a dielectric layer 150 on the conformal etch stop layer. Dielectric layer 150 can be a blanket layer of interlayer dielectric (ILD) material (e.g., a blanket layer of silicon dioxide layer or a blanket layer of any other suitable ILD material). Additional MOL processing can include, but is not limited to, formation of MOL contacts 151-153 and a polishing process (e.g., a chemical mechanical polishing (CMP) process) to planarize the top surface of dielectric layer 150 and remove any contact material from the top surface thereof.

A multi-level field plate can then be formed on the top surface of dielectric layer 150 (see process 506). In a HEMT, this multi-level field plate can be formed on the top surface of dielectric layer 150 above an area of the device that extends between gate terminal 130 and drain terminal 120.

Figure 7:
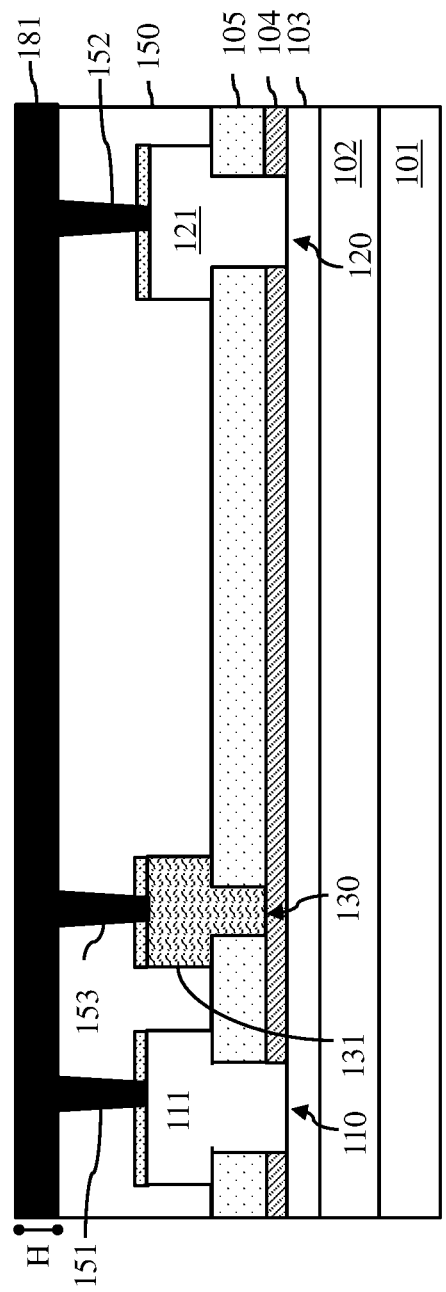

To form a multi-level field plate, a first metallic layer 181 with a thickness H can be formed over the partially completed structure (see process 512 and FIG. 7). First metallic layer 181 can be included in a back end of the line (BEOL) metal level, such as the first BEOL metal level (M1). First metallic layer 181 can include one or more layers of metal or metal alloy material(s). For example, first metallic layer 181 could be copper. Alternatively, first metallic layer 181 could be any other suitable BEOL metal or metal alloy material(s) now known or subsequently developed (e.g., aluminum, cobalt, ruthenium, molybdenum, iridium, etc. or alloys thereof). Techniques for depositing metallic layer deposition are well known in the art and, thus, the details thereof have been omitted from this specification.

Figure 8:
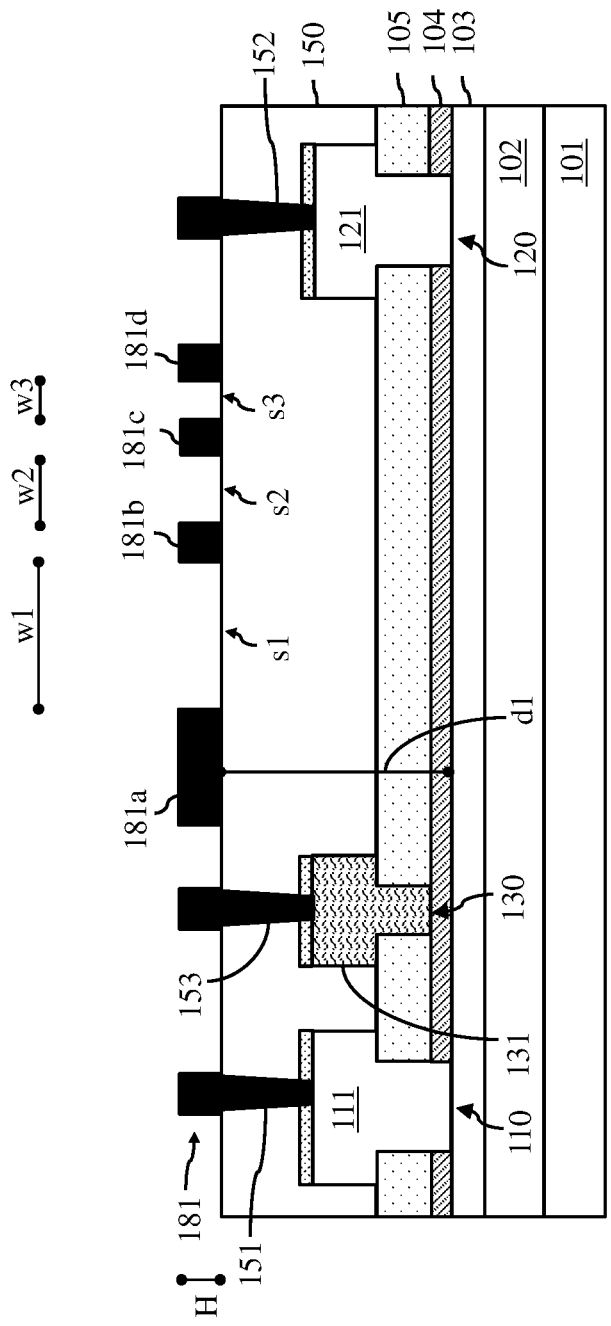

First metallic layer 181 can then be lithographically patterned and etched to form any number of three or more first conductors on the top surface of dielectric layer 150 (see process 514 and FIG. 8). For purposes of illustration, four first conductors 181a-181d are shown in FIG. 8. It should be understood that the figures and description are not intended to be limiting. Alternatively, only three first conductors (e.g., 181a-181c) or more than four first conductors could be formed at process 514. In any case, first conductors 181a-181c (and, optionally, 181d) can be formed at process 514 so as to have the same or different widths and so that they are physically separated from each other by spaces. Each space between a pair of adjacent first conductors can have a corresponding width.

For example, as illustrated in FIG. 8, space s1 between adjacent first conductors 181a and 181b can have a width w1. Space s2 between adjacent first conductors 181b and 181c can have a width w2. Optionally, space s3 between adjacent first conductors 181c and 181d can have a width w3, and so on. Furthermore, at least some of the spaces can have different widths (e.g., progressively decreasing widths from adjacent gate terminal 130 toward drain terminal 120 in a HEMT). That is, as illustrated, width w1 of space s1 can be greater than width w2 of space s2, and so on. When all first conductors have the same height H and the spaces between adjacent first conductors have progressively decreasing widths, the aspect ratio of space s2 can be relatively high and, particularly, higher than the aspect ratio of space s1, and so on.

Figure 9:
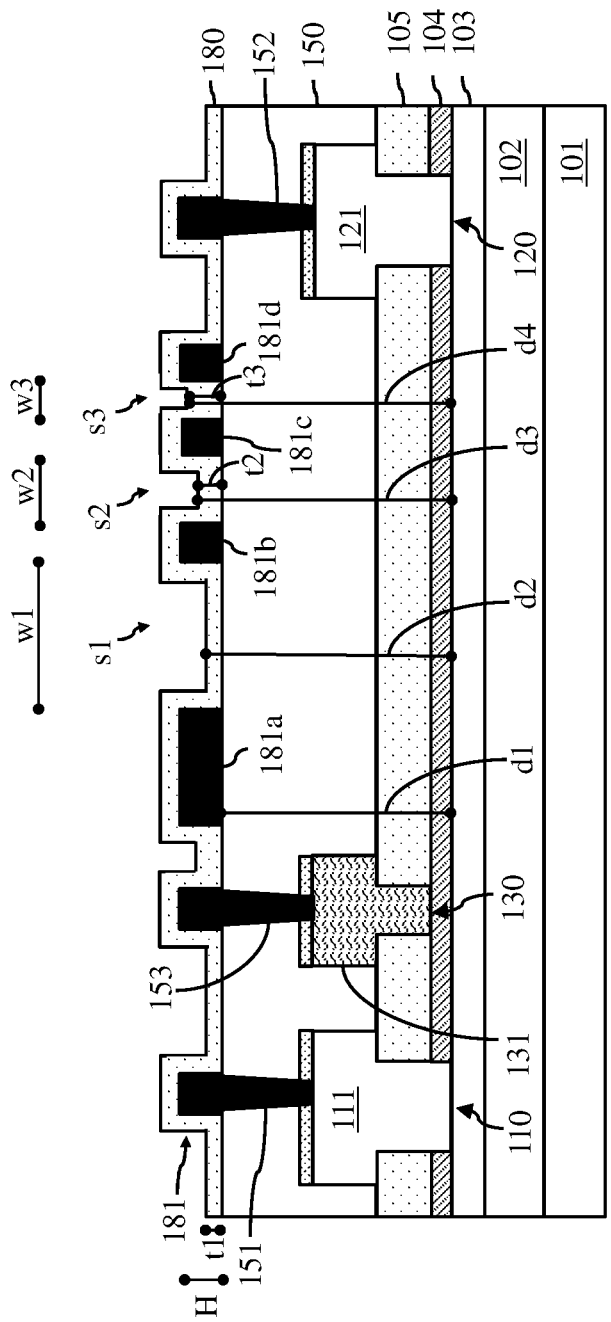

An additional dielectric layer 180 can be formed (e.g., conformally deposited) over the partially completed structure (i.e., over the first conductors and on exposed surfaces of dielectric layer 150 in the spaces between the first conductors) (see process 516 and FIG. 9). Additional dielectric layer 180 formed at process 516 can include a relatively thin conformal layer of a dielectric material (e.g., silicon nitride, silicon dioxide, silicon oxynitride or any other dielectric material employed in BEOL processing). Alternatively, additional dielectric layer 180 can include a stack of two or more relatively thin conformal layers of different dielectric materials (e.g., silicon nitride and one or more additional dielectric materials).

Generally, additional dielectric layer 180 can be deposited so as to have a thickness t1 that is less than (e.g., ¼, ⅕, ⅙, etc.) the height H of first conductors 181a-181d, as measured from the top surface of dielectric layer 150 in either open areas devoid of any patterned plates and/or wires of first metallic layer 181 or at the center of relatively low aspect ratio spaces between patterned plates and/or wires of first metallic layer 181 (e.g., as measured between adjacent first conductors 181a and 181b at the center of space s1). However, at the centers of any relatively high aspect ratio spaces (e.g., see spaces s2 and s3), horizontal portions of additional dielectric layer 180 may be relatively thick (e.g., see thickness t2 and t3). With any such thickness(es) greater than t1 being the result of pinch off when additional dielectric layer 180 is deposited into high aspect ratio space(s).

It should be noted that where first conductors 181a-181c and optional first conductor 181d are separated by spaces with progressively decreasing widths (e.g., w1>w2>w3) as discussed above, portions of additional dielectric layer 180 at the centers of those spaces can have progressively increasing thicknesses (e.g., from adjacent gate terminal 130 toward drain terminal 120 in a HEMT). That is, thickness t2 of the horizontal portion of additional dielectric layer 180 at the center of space s2 can be greater than thickness t1 of the horizontal portion of additional dielectric layer 180 at the center of space s1 and, if applicable, thickness t3 of the horizontal portion of additional dielectric layer 180 at the center of space s3 can be greater than the thickness t2.

Figure 10:
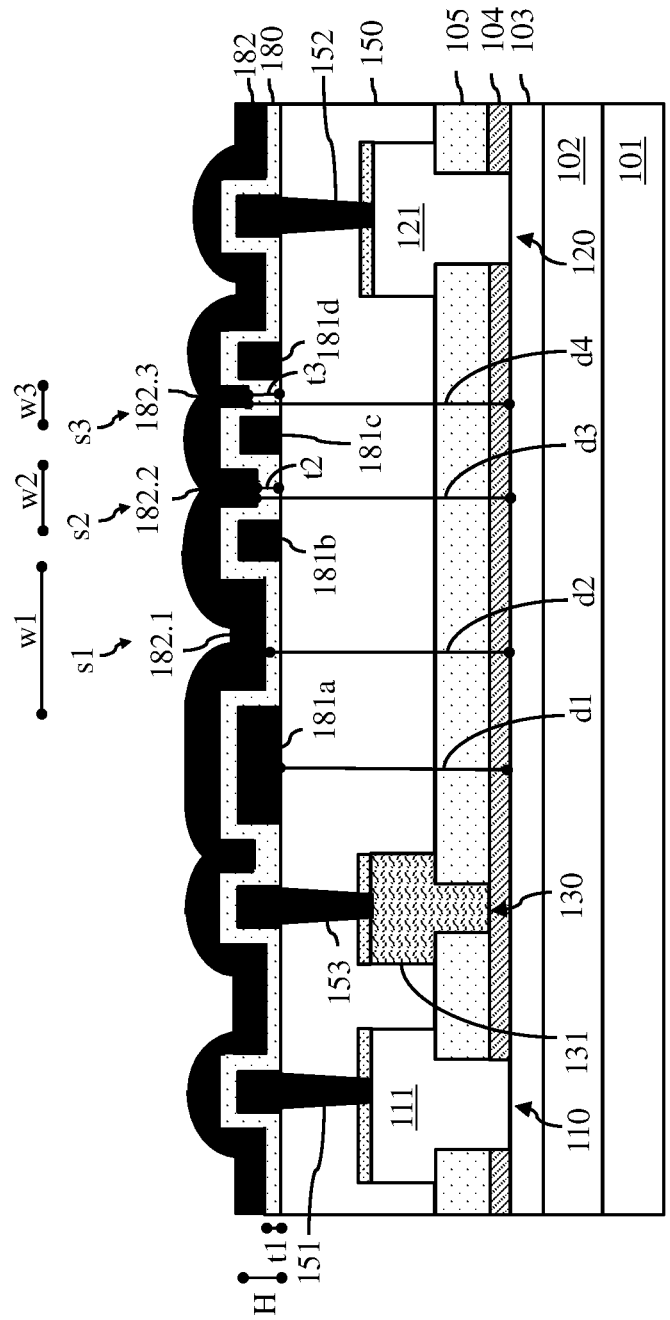

A second metallic layer 182 can then be formed (e.g., conformally deposited) over the partially completed structure including into the spaces (see process 518 and FIG. 10). Second metallic layer 182 can be included in a back end of the line (BEOL) metal level, such as the second BEOL metal level (M2). Second metallic layer 182 can include one or more layers of metal or metal alloy material(s). The metal or metal alloy material(s) of second metallic layer 182 can be the same as the metal or metal alloy material(s) of the first metallic layer 181. Alternatively, the metal or metal alloy material(s) of the first and second metallic layers 181-182 could be different. Thus, second metallic layer 182 could be copper. Alternatively, second metallic layer 182 could be any other suitable BEOL metal or metal alloy material(s) now known or subsequently developed (e.g., aluminum, cobalt, ruthenium, molybdenum, iridium, etc. or alloys thereof).

Second metallic layer 182 can then be lithographically patterned and etched to form any number of one or more second conductors having second conductor portions 182.1-182.2 extending into spaces s1-s2 (and, if applicable second conductor portion 182.3 extending into space s3) (see process 520). Patterning of the second metallic layer 182 can specifically be performed at process 520 to create the various second conductor configurations as described in detail above and illustrated in multi-level field plate 160 of FIGS. 1A-1C, in multi-level field plate 260 of FIG. 2, multi-level field plate 360 of FIG. 3, or multi-level field plate 460 of FIG. 4.

Additional processing can include completion of BEOL processing. Such BEOL processing can include, but is not limited to, formation of interconnects that will electrically connect first conductor(s) and/or second conductor(s) of the multi-level field plate to a biasing circuit or to ground. It should however be understood that, optionally, one or more of the first conductors and/or the second conductors of the multi-level field plate could be left floating.

It should be understood that in the method and structures described above, a semiconductor material refers to a material whose conducting properties can be altered by doping with an impurity. Examples of semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a," "an," and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A structure comprising:
a dielectric layer; and
a field plate including:

at least three first conductors above and immediately adjacent to the dielectric layer and laterally separated by spaces, wherein at least two of the spaces have different widths;

an additional dielectric layer on the first conductors and within the spaces above the dielectric layer; and at least one second conductor on the additional dielectric layer, wherein at least two second conductor portions extend into at least two of the spaces, respectively, and, within the at least two of the spaces, the at least two second conductor portions are at different heights above the dielectric layer.

2. The structure of claim 1, wherein the field plate includes three first conductors and a single second conductor.

3. The structure of claim 1, wherein the field plate includes four first conductors and a single second conductor.

4. The structure of claim 1, further comprising a transistor including:

a channel layer;

a barrier layer on the channel layer;

a cap layer on the barrier layer, wherein the cap layer comprises an isolation material;

a gate terminal extending through the cap layer to the barrier layer; and a drain terminal extending through the cap layer into the barrier layer, wherein the dielectric layer is on the transistor, and wherein the field plate is on the dielectric layer between the gate terminal and the drain terminal.

5. The structure of claim 4, wherein the first conductors are patterned from a first metallic layer, wherein the at least one second conductor is a single second conductor patterned from a second metallic layer, and wherein the single second conductor has a first end proximal to the gate terminal, and a second end proximal to the drain terminal.

6. The structure of claim 5, wherein the first end is above a first one of the first conductors closest to the gate terminal and the second end is above a last one of the first conductors closest to the drain terminal.

7. The structure of claim 4, wherein the spaces have progressively decreasing widths from adjacent the gate terminal toward the drain terminal, wherein, due to the progressively decreasing widths of the spaces, portions of the additional dielectric layer at centers of the spaces have progressively increasing thicknesses from adjacent the gate terminal toward the drain terminal, and wherein, due to the progressively increasing thicknesses of the portions of the additional dielectric layer at the centers of the spaces, the at least two second conductor portions extending into the spaces are at progressively increasing heights above the dielectric layer from adjacent the gate terminal toward the drain terminal.

8. The structure of claim 4, wherein the transistor further includes a gate dielectric layer between the gate terminal and the barrier layer.

9. The structure of claim 4, wherein the transistor further includes a source terminal extending through the cap layer into the barrier layer, wherein the gate terminal is positioned laterally between the source terminal and the drain terminal, and wherein the gate terminal is closer to the source terminal than the drain terminal.

10. A structure comprising:

a dielectric layer; and a field plate including:

first conductors on the dielectric layer and laterally separated by spaces, wherein at least two of the spaces have different widths;

an additional dielectric layer extending over the first conductors and within the spaces above the dielectric layer; and second conductors on the additional dielectric layer, wherein the second conductors have second conductor portions extending into the spaces, respectively, and wherein the second conductor portions are at different heights above the dielectric layer.

11. The structure of claim 10, wherein the field plate includes one of:

three first conductors and two second conductors; and four first conductors and three second conductors.

12. The structure of claim 10, further comprising a transistor, wherein the transistor includes:

a channel layer;

a barrier layer on the channel layer;

a cap layer on the barrier layer, wherein the cap layer comprises an isolation material;

a gate terminal extending through the cap layer to the barrier layer; and a drain terminal extending through the cap layer into the barrier layer, wherein the dielectric layer is on the transistor, and wherein the field plate is above the dielectric layer between the gate terminal and the drain terminal.

13. The structure of claim 12, wherein the first conductors are patterned from a first metallic layer and wherein the second conductors are patterned from a second metallic layer.

14. The structure of claim 12, wherein the spaces between the first conductors have progressively decreasing widths from adjacent the gate terminal toward the drain terminal, wherein, due to the progressively decreasing widths of the spaces, portions of the additional dielectric layer at centers of the spaces have progressively increasing thicknesses from adjacent the gate terminal toward the drain terminal, and wherein, due to the progressively increasing thicknesses of the portions of the additional dielectric layer at the centers of the spaces, the second conductor portions extending into the spaces are at progressively increasing heights above the dielectric layer from adjacent the gate terminal toward the drain terminal.

15. The structure of claim 12, wherein the transistor further includes a gate dielectric layer between the gate terminal and the barrier layer.

16. The structure of claim 12, wherein the transistor further includes a source terminal extending through the cap layer into the barrier layer, wherein the gate terminal is positioned laterally between the source terminal and the drain terminal, and wherein the gate terminal is closer to the source terminal than the drain terminal.

* * * * *